United States Patent
Hofmann et al.

(10) Patent No.: US 8,230,587 B2
(45) Date of Patent: Jul. 31, 2012

(54) CARRIER FOR ALIGNING ELECTRONIC COMPONENTS WITH SLIDABLY ARRANGED PLATES

(75) Inventors: Thomas Hofmann, Stephanskirchen (DE); Johann Poetzinger, Fischbachau (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 8 days.

(21) Appl. No.: 12/859,106

(22) Filed: Aug. 18, 2010

(65) Prior Publication Data

US 2011/0042265 A1 Feb. 24, 2011

Related U.S. Application Data

(60) Provisional application No. 61/234,940, filed on Aug. 18, 2009.

(51) Int. Cl.
*B23P 19/00* (2006.01)
(52) U.S. Cl. ............ 29/739; 29/740; 29/741; 206/701
(58) Field of Classification Search .............. 29/739, 29/740, 827; 206/830, 842, 701
See application file for complete search history.

(56) References Cited

U.S. PATENT DOCUMENTS

| | | | |
|---|---|---|---|
| 4,427,249 A | | 1/1984 | Bright et al. |
| 4,782,589 A | * | 11/1988 | Dennis ........................ 29/827 |
| 5,176,255 A | * | 1/1993 | Seidler ....................... 206/724 |
| 5,215,472 A | * | 6/1993 | DelPrete et al. ............. 439/71 |
| 5,307,929 A | * | 5/1994 | Seidler ....................... 257/676 |
| 5,333,375 A | * | 8/1994 | Dennis et al. ................ 29/827 |
| 5,596,229 A | | 1/1997 | Simon |
| 5,872,458 A | | 2/1999 | Boardman et al. |
| 5,878,485 A | * | 3/1999 | Wood et al. .................. 29/825 |
| 6,268,740 B1 | | 7/2001 | Iida |
| 7,156,680 B2 | | 1/2007 | Saito |
| 7,258,703 B2 | * | 8/2007 | Cheng et al. ............. 29/25.01 |
| 7,410,363 B1 | * | 8/2008 | Gattuso et al. ............... 439/71 |
| 2003/0017629 A1 | * | 1/2003 | Tsui et al. ..................... 438/14 |
| 2005/0072714 A1 | * | 4/2005 | Eleveld ....................... 206/701 |
| 2006/0154386 A1 | * | 7/2006 | Cheng et al. ................. 438/15 |

FOREIGN PATENT DOCUMENTS

WO WO 2009/100910 A1 8/2009

OTHER PUBLICATIONS

International Search Report dated Jul. 6, 2011 for International application No. EP 2-290-375 A3; 3 pages.

* cited by examiner

*Primary Examiner* — Carl Arbes
(74) *Attorney, Agent, or Firm* — Christie, Parker & Hale, LLP

(57) ABSTRACT

A carrier adapted to receive and align multiple electronic components, the carrier having receptacles each being adapted to receive an assigned one of the multiple electronic components, a first plate comprising a plurality of first abutting sections, the first abutting sections form one of boundaries of the respective assigned receptacles, a second plate comprising a plurality of second abutting sections, the second abutting sections form another of the boundaries of the respective assigned receptacles, and the first plate and the second plate are arranged slidably relative to each other.

19 Claims, 4 Drawing Sheets

CARRIER FOR ALIGNING ELECTRONIC COMPONENTS WITH SLIDABLY ARRANGED PLATES

CROSS-REFERENCE TO RELATED APPLICATION

This application claims the benefit of U.S. Provisional Patent Application No. 61/234,940, filed on Aug. 18, 2009 in the United States Patent and Trademark Office, the entire content of which is incorporated herein by reference.

FIELD OF THE INVENTION

The invention relates to a carrier for receiving and aligning multiple electronic components.

Moreover, the invention relates a method of operating a carrier.

BACKGROUND OF THE INVENTION

Integrated circuits are usually fabricated on semiconductor wafers. The integrated circuits have a variety of uses and can be found in versatile electric devices. Depending on the purposes they are made for the integrated circuits and other electronic components such as resistors, capacitances and inductances are packaged, marked and tested before being assembled. For example, MEMS (micro electro mechanical system) components are tested under given temperatures, pressure, angles of inclination and different types of accelerations. Hence, the complete manufacturing of electronic components can be divided into processes of pure fabrication and a process after finishing the contact patterns of the electronic components. There are two types of machine which handle electronic components the so called "Gravity handler" and "Pick & Place-Handler" handling singulated electronic components and the "Strip handler" which handle so called strips.

US 2003/0017629 A1 discloses an apparatus for supporting singulated electronic devices during a testing operation, comprising: a main body and a support member, wherein said support member is made of non-conducting high-resistivity material and comprises a plurality of recesses, each said recess being adapted to receive an individual singulated device. There is also disclosed a method for testing such devices in which the devices are carried on support members through a testing process including one or more environmental control chambers.

US 2006/0154386 A1 discloses an apparatus and method are provided for aligning a plurality of semiconductor devices placed on a carrier. Alignment guides are located adjacent to each device in use, and arranged such that they correspond to a desired alignment of each semiconductor device. For alignment, the semiconductor devices are held by a positioning device comprising a plurality of holders, each holder being configured to generate a force to hold a semiconductor device. Actuators are also provided that are operative to move the positioning device and holders to bias the semiconductor devices against the alignment guides to orientate the semiconductor devices until they are aligned with said alignment guides.

U.S. Pat. No. 7,156,680 B2 discloses an insert and electronic component handling apparatus provided with the same. To provide a guide core capable of being detachably attached to an insert body and an insert body to which the guide core can be detachably attached, U.S. Pat. No. 7,156,680 B2 provides a guide core able to be attached in a detachable way to an insert body, comprising a supporting portion capable of supporting an external terminal face of an area array type electronic component so that external terminals of the area array type electronic component are exposed to the direction of connection terminals of a socket, and a hook receiver able to be engaged in a releasable way with a hook portion provided to the insert body, and an insert body able to be attached in a detachable way with the guide core, comprising an electronic component guide portion comprising a guide core attachment socket to which the guide core is attached, and an electronic component inlet connected with the guide core attachment socket so that an electronic component can be guided to the guide core attached to the guide core attachment socket, and a hook portion able to be engaged in a releasable way with a hook receiver provided to the guide core.

U.S. Pat. No. 5,596,229 A discloses a chip carrier structure for containing a chip carrier having electrical contact pads having a positioning structure for the chip carrier and a slotted structure mated to form a mated structure containing said chip carrier, the slots of the slotted structure being in alignment with the pads of the chip carrier to provide electrical and mechanical access to the pads from the exterior to the interior of the mated positioning and slotted structures.

OBJECT AND SUMMARY OF THE INVENTION

There may be a need for a system capable of receiving and aligning an electronic component in an efficient way.

In order to achieve the object defined above a carrier and a method of operating a carrier having the features according to the independent claims are provided.

According to an exemplary embodiment of the invention, a carrier for receiving and aligning multiple electronic components is provided, wherein the carrier comprises receptacles each being adapted (particularly intended) to receive an assigned one of the multiple electronic components, a first plate comprising a plurality of first abutting (particularly touching) sections (particularly segments), wherein the first abutting sections form one of boundaries (particularly a surface that indicates or fixes a limit or extent) of the respective assigned receptacles; a second plate comprising a plurality of second abutting sections, wherein the second abutting sections form another of the boundaries of the respective assigned receptacles; and wherein the first plate and the second plate are arranged slidably (particularly gliding or slipping) relative to each other (for instance to clamp the electronic components in the receptacles).

According to another exemplary embodiment of the invention, a method of using a carrier is provided, wherein the method comprises:

receiving an assigned one of the multiple electronic components in each of receptacles of the carrier;

providing a first plate of the carrier comprising a plurality of first abutting sections, wherein the first abutting sections form one of boundaries of the respective assigned receptacles;

providing a second plate of the carrier comprising a plurality of second abutting sections, wherein the second abutting sections form another of the boundaries of the respective assigned receptacles; and sliding the first plate and the second plate relative to each other to clamp the electronic components in the receptacles.

The term "carrier" may particularly denote a container for carrying or a device that carries. A carrier may be a strip-like member adapted for carrying multiple electronic components in receptacles of the carrier. Such a carrier may be formed as a layer sequence of multiple laminated plates such as processed (for example patterned) metal sheets. Such a carrier may be used in conjunction with a handler allowing to handle the electronic devices using the carrier for subsequently carrying out a test (such as a function test) of the electronic components.

The term "align" may particularly denote that something is ranged or lined up. E.g. an electronic component may be aligned with a fixed abutting section.

The term "electronic component" may particularly denote any component adapted for being mounted on an electronic support substrate such as a printed circuit board. Such electronic components may also be handled by a handling machine, the so called "handler". Examples for electronic components are electronic chips, i.e. packaged dies or naked unpackaged dies.

The term "receptacle" may particularly be denoted as device to receive and contain something or may more particularly be denoted as a container for an electronic component.

The term "plate" may particularly denote a smooth flat thin piece of material. More particularly a plate may be made up of multiple parts and the plate may comprise trenches, cuts, recesses or even protrusions. The plate may comprise varying thicknesses and the plate may be made of different materials. Even more particularly the plate may be formed from a metal plate, especially a metal sheet, such as a spring metal sheet. The plate may be coated with different coatings for changing surface properties, such as electrical resistance or abrasion resistance.

The term "abutting section" may particularly denote a touching segment, i.e. a portion of a receptacle which directly abuts to an electronic component.

The term "form boundaries" may particularly denote something that indicates or fixes a limit or an extent. More particularly it may denote that something is delimited or even more particularly that something is defined, e.g. by the abutting sections.

The term "slidably" or "slide" may particularly denote to move smoothly along a surface. The sliding of one plate relative to another plate may particularly result in a restoring elastic force driving back one plate relative to the other plate.

According to an exemplary embodiment of the invention, the carrier may comprise multiple receptacles each receiving an assigned one of the multiple electronic components. The size of the multiple receptacles may be delimited by the first abutting sections of the first plate and the second abutting sections of the second plate. The first abutting sections of the first plate and the second abutting sections of the second plate may lie on opposed sides of the receptacles. The first plate and the second plate may be movable relative to each other along a main plane of the first plate and a main plane of the second plate which main plane of the first plate and main plane of the second plate may coincide or may be parallel to each other. The size of the receptacles may change when the relative position of the first plate and the second plate are changed relative to each other. The first plate and the second plate may lie parallel to each other. The position of the first plate and of the second plate may be changed diagonally, i.e. a corner region of the first plate and a corner region of the second plate may be approached and contrary to this pulled apart. The first plate and the second plate and by this the boundaries of the first abutting sections and the second abutting sections may collectively approach and pulled apart parallel to coinciding main planes of the first plate and the second plate. The multiple electronic components may be clamped between the multiple first abutting sections and the multiple second abutting sections in the multiple receptacles when the first abutting sections of the first plate and the second abutting sections of the second plate approach.

In the following, further exemplary embodiments of the carrier will be described. However, these embodiments also apply to the method.

The first plate may be an elastic unit plate comprising a plurality of elastic units (for instance arranged in a matrix in rows and columns), wherein each of the receptacles has assigned at least one of the plurality of the elastic units. The first abutting sections may be each formed on an elastic unit respectively. The term "elastic unit" particularly denotes a piece or complex of apparatus serving to perform one particular function wherein in this case the function may be being flexible, resilient or springy. The purpose of the elastic unit may be that compensatory tolerances for varying dimensions of the multiple electronic components may be permitted. Otherwise due to the varying dimensions of the electronic components the electronic components may fall out of the receptacles or misalignment may be caused. The elastic units may be particularly elastic coatings or rubber parts causing elastic properties of the first abutting sections. The elastic unit may also be any units being elastic, such as any kind of springs, for instance meandrical springs.

The first plate may move along the second plate on which the first plate may be arranged. At least in one direction which may be the direction towards the second plate the first plate may be secured against unwanted deformation. The second plate may be planar or may have recesses adapted to guide the movement of the first plate and the assigned elastic units and first abutting sections. The carrier may be adapted to align the electronic components with the second abutting sections, wherein a first force may be exerted in a self-acting manner by the elastic units to which the first abutting sections are mounted. Each one of the first abutting sections may be mounted at least to an assigned one of the elastic units. The elastic units may each exert the first forces towards the second abutting sections. Each one of the second abutting sections may be assigned to one of the first abutting sections. The electronic components may be aligned with the second abutting sections.

A position or a deformation state of each of the elastic units may determine one of the boundaries of the respective assigned receptacles. The position of the elastic units may determine the dimensions of the receptacles and the deformation state of the elastic units may determine the dimensions of the receptacles. The position of the elastic units may mutually change with the position of the first plate and the second plate relative to each other. The position of each first abutting section may change relative to each second abutting section in the same way. The change of the position of the first plate and the second plate relative to each other may cause a mutual change of the dimensions of each receptacle in the same manner, i.e. the dimensions of the receptacles may increase or the dimensions of the receptacles may decrease mutually. In other words, operation of all receptacles can be performed simultaneously by merely moving the plates relative to one another. This allows for a very simple actuation of all receptacles at the same time. However, each receptacle may change its dimensions individually with a change of the deformation state of the elastic unit, respectively. The deformation state of the elastic unit and the dimension of the receptacle may increase when tensioning the elastic unit and may decrease when relieving the tension. Thus, an embodiment of the invention provides both easy operation and individual adjustment of the receptacles.

The first plate and the second plate may be elastically coupled to each other by at least one plate connecting elastic unit, i.e. one or more springs or the like elastically connecting both plates. The at least one plate connecting elastic unit may be under tension of the at least one plate connecting elastic unit when the dimensions of the receptacles are mutually increased and the tension of the plate connecting elastic unit may be released or relieved at least partially when the first plate and the second plate change their positions to reduced dimensions of the receptacles. The dimensions of the receptacles may be mutually decreased when the tension of the at least one plate connecting elastic unit is relieved in a self-acting manner. The plate connecting elastic unit may permit mutual clamping of the electronic components in the receptacles.

The second plate may comprise a first plate abutting section adapted for abutment of the first plate; and the first plate may comprise a second plate abutting section adapted for abutment of the second plate. The second plate abutting section and the first plate abutting section may define a clamping size of the receptacles when the first plate abutting section and the second plate abutting section abut on each other, wherein the clamping size of the receptacles may be adapted for a clamping of the electronic components in the respective receptacles. A clamping size of the receptacles, in which each receptacle may be adapted to clamp a respective electronic component, may be provided by a position of the first plate and the second plate relative to each other. The term "clamp" may particularly denote that the carrier is designed to have parts brought together for holding or compressing the electronic components. The parts which may be brought together are the first abutting section and the second abutting section.

The plate connecting elastic element and the plurality of elastic units may be adapted to provide a total force for a self-acting transition from an enlarged size of the receptacles in which the electronic components may be receivable in the receptacles towards a reduced clamping size of the receptacles in which the electronic components may be clamped. The total force may be defined by a force exerted by the at least one plate connecting elastic unit minus a force exerted by the plurality of elastic units when the electronic components come into clamping positions. The force of the at least one plate connecting elastic unit may be greater than the force exerted by the plurality of elastic units. The total force is positive and may provide a self-acting transition from an enlarged size of the receptacles to a clamping size of the receptacles in which the second plate abutting section of the first plate and the first plate abutting section of the second plate may abut on each other.

The carrier may further comprise one or more handling structures (particularly actuatable holes or actuatable pins) formed at the first plate and/or at the second plate and adapted for handling the first plate and the second plate to relatively move the slidably arranged first plate and second plate against a force of the plate connecting elastic element towards an enlarged size of the receptacles. The handling structure(s) of the carrier may be adapted to relatively move the first plate and the second plate against the total force provided by the force of the at least one plate connecting elastic unit and the force of the plurality of elastic units. The handling structures may be adapted to enlarge the receptacles against the total force to the enlarged size in which the bodies of the electronic components are receivable in the receptacles.

The carrier may comprise a third plate, wherein the first plate is arranged floatingly between the second plate and the third plate, wherein the second plate and the third plate are fixedly mounted to each other and wherein the first plate is the elastic unit plate and is adapted to allow for a mutual relocation of the multiple first abutting sections relative to the second abutting sections. The first plate comprising spring elements may be arranged between the second plate and the third plate. Thus, the spring elements of the first plate are guided by the second plate and by the third plate and may be protected from deformation in the direction of the adjacent second plate and in the direction of the third pate. The second plate and the third plate may be planar or may have recesses adapted to guide the movement of the first plate.

The carrier may further comprise a third plate, wherein the second plate is arranged floatingly between the first plate and the third plate, wherein the first plate and the third plate are fixedly mounted to each other and wherein the first plate is the elastic unit plate and the second plate is adapted to allow for a mutual relocation of the multiple second abutting sections relative to the first abutting sections. The second plate comprising the second abutting sections may be guided between the first plate and the third plate. The first plate comprising the first abutting sections and the elastic units may be located externally. The elastic units may be accessible directly. Frictional forces may be small for elastic units being located externally. The first plate and the third plate may be planar or may have recesses adapted to guide the movement of the third plate and of the second abutting sections.

The first abutting sections may be adapted to exert the first forces, and the second abutting sections may be adapted to exert second forces on the electronic components, wherein the first forces and the second forces may be at least partially opposed (particularly are exerted against one another, i.e. antiparallel) to one another. The electronic components may be aligned in the receptacles of the align fixtures. The first abutting sections and the second abutting sections abut on side sections of the electronic components. According to the exerted forces, the electronic components may rest and be aligned if the forces exerted on each of the electronic components are at least not directed in one direction. Each of the multiple electronic components may rest, by including frictional forces, when the two forces exerted on the electronic component by the first abutting sections and the second abutting sections are at least partially opposed.

The first abutting sections and the second abutting sections may be adapted so that the first forces are exerted in main planes of the receptacles (i.e. a force vector may lie within the main planes) and the second forces are exerted parallel to this main plane of the receptacle. The main planes of the receptacles may be defined by being parallel to main planes of the align fixtures and may be parallel to main planes of the first plate, the second plate and the third plate. The electronic components may be aligned in an appropriate way if the forces exerted by the first abutting sections and the second abutting sections are exerted in one plane. The first abutting sections and the second abutting sections may abut on side sections of the electronic components. By exerting both the first forces and the second forces in a main plane of the receptacle the total forces on the electronic components show no turning moment having the tendency to flip the electronic components out of the receptacles. The electronic components may be firmly aligned in the receptacles by forces being parallel to the main planes of the receptacles.

In particular, the first abutting sections and the second abutting sections are adapted so that the first forces are exerted parallel to main planes of the receptacles and the second forces are exerted parallel to main planes of the receptacles.

Each of the receptacles may further comprise an assigned base support section which forms a support surface (particularly something to hold up in position by serving as a foundation) parallel to a main plane of the assigned receptacle. The support forces exerted by the base support sections may act on the main planes of the electronic components, particularly may be antiparallel to the gravitational force. The electronic components may be arranged in the receptacles so that the main plane of the receptacles and the main plane of the electronic components are parallel. The base support sections acting on the electronic components may be parallel to a main plane of the receptacles so that the electronic components are aligned by the support of the base support sections in the main plane of the receptacles. An advantage of supporting the electronic components in the main plane of the electronic components may be that the load on the electronic components may be dispersed on different parts of the main surfaces of the electronic components and that the first forces and the second forces of the first abutting sections and the second abutting sections may be exerted parallel to the base support sections. Thus, the orientation of the first forces and the orientation of the second forces may avoid cracking of the electronic components on the base support sections.

In particular, the receptacles may further comprise base support sections which form support surfaces parallel to main planes of the receptacles and which are adapted for supporting a bottom side of the electronic components when being received in the receptacles.

The base support sections may be adapted to exert support forces perpendicular (particularly vertical) to the first forces and to the second forces. The support force exerted by each of the base support sections may be adapted to align the electronic components rectangular to their main plane. The technical advantage of the support forces being perpendicular to the forces exerted by the first and second abutting sections may be that there is no turning moment being exerted on each of the multiple electronic components. Hence, the electronic components may remain in aligned positions relative to their main planes.

The first abutting sections being flexibly mounted may be adapted to perform a movement parallel to a main plane of the receptacles. The forces exerted by the abutting sections which are flexibly mounted are exerted parallel to a main plane of the receptacles. The forces to align the electronic components may be provided by the elastic units and the elastic units may move the flexibly mounted first abutting sections and the electronic components in a main plane of the receptacles by the self-acting movement of the elastic units in the main plane of the receptacles themself. Thus, the forces of the elastic units may be exerted on the electronic component in a plane in which the electronic components are predominantly rugged or stable.

The carrier may further comprise at least one distance adjusting plate adapted for adjusting thicknesses. For distance adaption purposes the carrier may comprise even more than three plates.

In particular, the carrier may comprise at least one thickness adjusting plate adapted for adjusting a thickness of the carrier.

At least one of the elastic units may comprise a spring element.

At least one of the elastic units comprises a first spring element and a second spring element, wherein a respective first abutting section is connected with the first spring element and with the second spring element.

The elastic units may comprise spring elements (particularly a rubber member, any kind of elastic material member, a spring formed from a steel spring plate, a spring formed from a spring wire or any kind of springs such as flat springs, coil springs, leaf springs, etc.). The spring elements may be integrally formed from a plate or may be separate components to be assembled individually to a plate. The spring elements may show similar properties compared to the elastic units wherein the elastic units may be formed from several parts. The spring elements may show elastic restore forces against deformation, i.e. a Hook behaviour.

The elastic units may comprise each first spring elements and second spring elements, wherein the first abutting sections are connected with the first spring elements and with the second spring elements. In one embodiment the first spring elements and the second spring elements are angularly arranged relative to one another. Depending on the shape, material and size of the spring elements it may be advantageous to combine a first spring element and a second spring element to an elastic unit. Even more than two spring elements may form an elastic unit. By combining two or more spring elements to an elastic unit the direction and absolute value of the force exerted by the elastic units may be adapted. In one embodiment the first spring elements and the second spring elements are angularly arranged relative to one another.

The first abutting sections and the elastic units may be at least partially integrally formed from a plate.

The second abutting sections and the base support sections may be at least partially integrally formed from one plate. It may be convenient to manufacture at least one functional element from a plate by using design techniques such as etching techniques or laser techniques. These techniques may be optimally suitable for applying them on thin plates, for instance metal plates. By etching or laser cutting, a high accuracy for the structures being manufactured may be achieved.

In the following, further exemplary embodiments of the method will be described. However, these embodiments also apply to the align fixture and to the carrier.

The method may further comprise placing the carrier in a post processing machine and subsequently subjecting the electronic components to an operation of the post-processing machine while the electronic components maintain in aligned positions in the receptacles of the carrier. A method of post-processing may particularly denote a process of evaluation or test of electronic components. Hence, a post-processing machine may particularly denote a machine for evaluating or testing of electronic components. During post-processing the electronic components may be subjected under various physical conditions to get information about the quality of the electronic components. Post-processing may particularly denote a quality test or a quality evaluation of the electronic component by subjecting the electronic components under the various electrical and/or mechanical conditions of interest. Post-processing may also denote to subject electronic components under various electrical and/or mechanical conditions alone.

The method may further comprise elastically clamping the electronic components by the clamping mechanism exclusively on side sections of the electronic components. The electronic components may be placed in enlarged receptacles of a carrier and thereupon may be elastically clamped and aligned by a clamping mechanism in a clamping size of the receptacles. The transition of the enlarged size of the receptacles to a clamping size of the receptacles may take place in a main plane of the receptacle. The main plane of the receptacle may match with a main plane of the carrier, with a main plane of the electronic component and with a main plane of the align fixture. The carrier may be put into a post-processing machine. While the electronic components are clamped and aligned in the receptacles the electronic components may be subjected to operations of the post-processing machine.

The method may further comprise providing the carrier with an identifying feature or an identifier for definite (particularly precise, unique or unambiguous) identification of the carrier. Post-processing machines may form an assembly line. The carriers may be transported from one post-processing machine to a further post-processing machine. A unique identification of each of the carriers in a plant during post-processing enables tracking (particularly tracing) the way of each of the carriers in the plant and enables tracking each of the electronic components. Thus, by the identifying feature each of the carriers and each of the electronic components may be tracked in an assembly line.

The method may further comprise providing the carrier with fiducial markers for fiducial detection. A vision system together with fiducial markers or marks may provide a detection of the position and orientation of the carrier in a post-processing machine. This may be advantageous when operating processes which need accurate alignment of the carrier such as for marking or contacting the electronic components.

The method may comprise aligning the electronic components with the second abutting sections, wherein the first force may be exerted in a self-acting manner by elastic (particularly flexible, resilient or springy) units (particularly a piece or complex of apparatus serving to perform one particular function) to which the first abutting sections are mounted. Each one of the first abutting sections may be mounted at least to an assigned one of the elastic units. The elastic units may each exert the first forces towards the second abutting sections. Each one of the second abutting sections is assigned to one of the first abutting sections. The electronic components may be aligned with the second abutting sections.

The method may further comprise exerting two force components on at least one of the first abutting sections and the second abutting sections so that these abutting sections exert two angled force components on the electronic components.

The post-processing may comprise laser marking while the electronic components are held and aligned by the carrier and are moved by handling the carrier. While the electronic components are clamped and aligned in the receptacles the electronic components may be subjected to a laser marking procedure. The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have access openings in their centres extending only so far that the edge regions of the electronic components still abut with the base support sections.

The post-processing may comprise a burn-in test while the electronic components are held and aligned by the carrier and are moved by handling the carrier. In a burn-in test the electronic components, especially semiconductor devices, may be subjected to heat for a predefined time interval (for instance temperatures of up to 200° C. for a fraction of an hour up to several hours). During the burn-in test the electronic components may be additionally subjected to a power test by a current feed and/or the electronic components may be subjected to an electronic test for testing the electronic quality of the electronic components. The carrier may be adapted to withstand high temperatures by forming the carrier of temperature resistant materials like metal, thermosetting plastics or resins.

The post-processing may comprise a bake-in process while the electronic components are held and aligned by the carrier and are moved by handling the carrier. The bake-in process may be a process where the electronic components are heated for a predefined time interval (for instance temperatures of up to 200° C. for a fraction of an hour up to several hours) without any electrical test or load. Forming the carrier from temperature resistant materials may enable the carrier to withstand bake-in processes, wherein the electronic components are subjected to high temperatures for a period of about one hour. The bake-in process may be used to reduce electrical load on the electronic components to further continue with a final test.

The post-processing may comprise a final test on a handler while the electronic components are held and aligned by the carrier and are moved by handling the carrier. The final test having a variety of embodiments may be a test being carried out before the electronic components are assembled. The final test of electronic components, e.g. semiconductor devices, may be an electronic functional test and may comprise a variety of physical test conditions, such as a variety of temperatures, pressures, accelerations and inclination angles in an arbitrary combination. Forming the carrier from a material or materials which withstand the mechanical and temperature strain the carrier may be adapted to align the electronic components under these variable conditions and may be adapted to allow for a contacting the contacts of the electronic components.

In an embodiment the post-processing does not comprise a final test on a handler while the electronic components are held and aligned by the carrier and are moved by handling the carrier. After laser marking, burn-in or bake-in directly a selective marking may be operated on the electronic components.

In particular, the post-processing is free of a final test on a handler while the electronic components are held and aligned by the carrier and are moved by handling the carrier.

The post-processing may comprise a selective marking while the electronic components are held and aligned by the carrier marking and are moved by handling the carrier. With reference to the explanation of the laser marking same is valid for selective marking, e.g. laser marking: The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have openings in their centres extending so far that the edge regions of the electronic components abut with the base support sections. After selective marking the electronic components placed in the carrier may be selectively marked "positive", selectively marked "negative" or may be completely marked either "positive" or "negative". Other classifications (different from "positive" or "negative") are possible as well. The selective marking may also comprise a mark pointing out a quality feature of the electronic components, e.g. a mark which signs the maximum frequency to operate a semiconductor device.

At least two of the group consisting of the laser marking, the burn-in test, the bake-in, the final test and the selective marking may be performed without removing the electronic components from the carrier. In other words, multiple of these or other procedures may be carried out while the electronic component remains aligned in the carrier. The carrier may be adapted to withstand a variety of physical conditions and may accurately align the electronic component through complete or partial post-processing. Thus, the electronic components may be held and aligned in the carrier during the complete post-processing or parts of post-processing.

After the post-processing the electronic components may be removed from the post-processing machine by removing the carrier from the post-processing machine while the electronic components are held and aligned by the carrier.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF EXEMPLARY EMBODIMENTS

Figure 1:
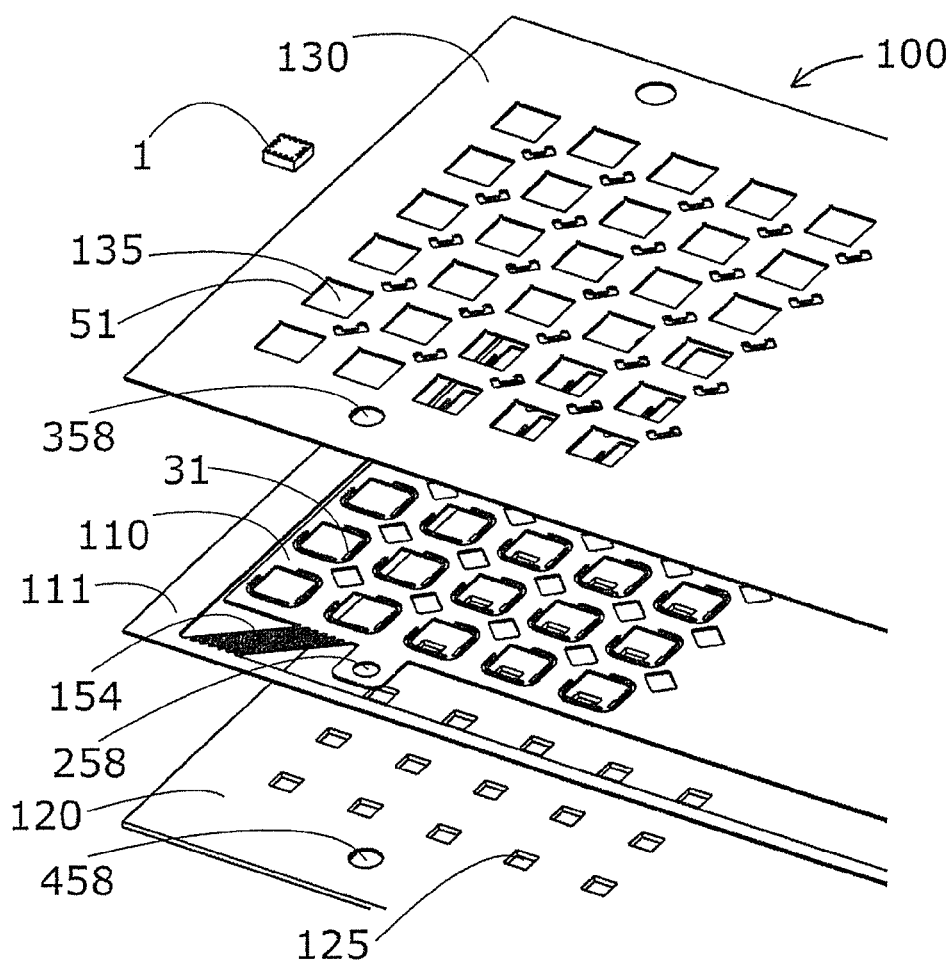
FIG. 1 shows an exploded view of a carrier according to an exemplary embodiment of the invention.

The illustration in the drawing is schematically. In different drawings, similar or identical elements are provided with the same reference signs.

FIG. 1 shows an exploded view of a carrier 100 according to an exemplary embodiment of the invention.

Carrier 100 is adapted to receive and align multiple electronic components 1 and comprising receptacles (see also reference numeral 20 in FIG. 4) each being adapted to receive an assigned one of the multiple electronic components 1. A spring plate 110 comprises a plurality of first abutting sections 31, wherein the first abutting sections 31 form one of boundaries of the respective assigned receptacles. A receiving plate 130 comprises a plurality of second abutting sections 51, wherein the second abutting sections 51 form another of the boundaries of the respective assigned receptacles. The spring plate 110 and the receiving plate 130 are arranged slidably relative to each other.

In the described embodiment, the sliding arrangement of the spring plate 110 and the receiving plate 130 is accomplished by fixing external frames of plates 110, 130 and by providing plate connecting elastic unit 154 via which the spring plate 110 is elastically coupled to a spring plate frame 111. Other embodiments may user other measures for slidingly coupling plates 110, 130, for instance by directly arranging one or more springs to couple these plates 110, 130 in a sliding way.

Hence, the carrier 100 comprises spring plate 110 surrounded by the spring plate frame 111. The spring plate 110 is elastically coupled to the spring plate frame 111 via the plate connecting elastic unit 154. Moreover, the carrier 100 comprises on one side of the spring plate 110 the receiving plate 130 and on the other side a base support plate 120. The receiving plate 130 comprises receiving openings 135 through which the electronic component 1 is to be received. The base support plate 120 comprises access openings 125 through which a main surface side of the electronic component 1 is accessible for operations. An elastic unit actuation hole 258 is aligned with an actuation access hole 358 of the receiving plate 130 and with an actuation access hole 458 of the base support plate 120. The diameter of the actuation access hole 358 of the receiving plate 130 and the diameter of the actuation access hole 458 of the base support plate 120 are larger than the diameter of the elastic unit actuation hole 154.

Figure 2:
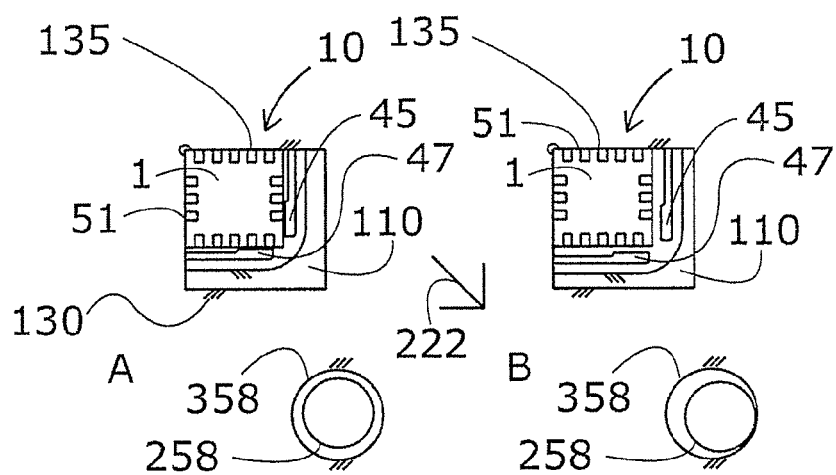
FIG. 2 shows a plan view (i.e. from above) of an align fixture of a carrier in two different positions.

FIG. 2, detail A, shows a view from above of an align fixture 10 of the carrier 100 of FIG. 1 in a clamping position. A first spring element 45 and a second spring element 47 together press the electronic component 1 against an abutting section 51 being an angled part of a rectangular receiving opening 135. The first spring element 45, the second spring element 47 and elastic unit actuation hole 258 are assigned to a spring plate 110. Actuation access hole 358 and the receiving opening are assigned to receiving plate 130. The actuation access hole 358 and the elastic unit actuation hole 258 are in an aligned position and the first spring element 45 and the second spring element 47 are in the clamping position.

FIG. 2, detail B, shows a view from above of the align fixture 10 in a receiving position. The elastic unit plate 110 with the assigned first spring element 45, the second spring element 47 and the elastic unit actuation hole 258 has been relocated relative to the receiving plate with the assigned second abutting section and the assigned actuation access hole 358 in the direction of the arrow 222. Thus, the smaller elastic unit actuation hole 258 has been relocated in the same direction and the same distance relative to the larger actuation access hole 358 so that the first spring element 45 and the second spring element 47 are relocated in the same direction and the same distance relative to the second abutting section 51. Thus, the first spring element 45 and the second spring element 47 are in the receiving position since a space between the first and second spring element 45 and 47 and the second abutting section 51 is larger than the electronic component 1 to be received.

Figure 3:
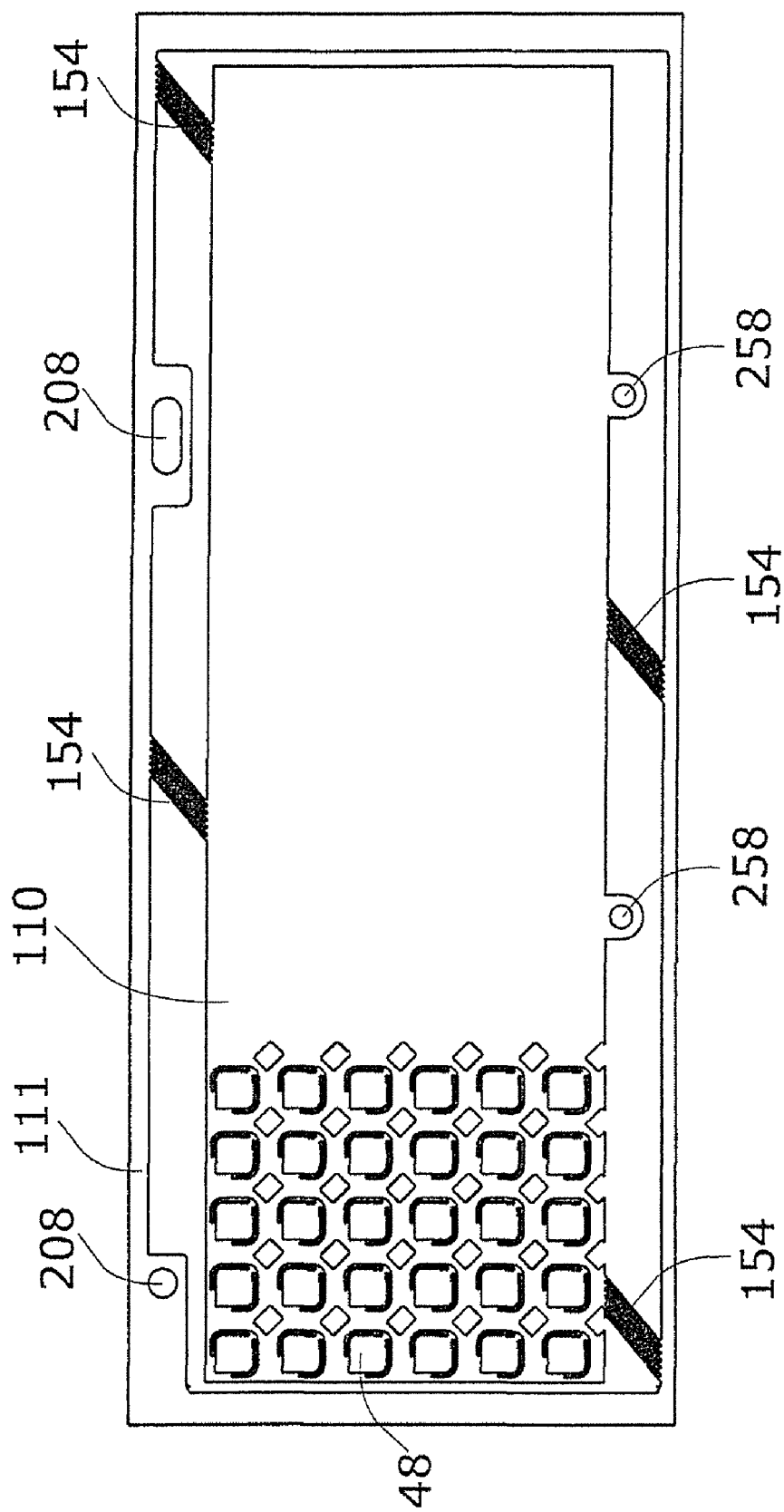
FIG. 3 shows a general view of a spring plate of the carrier according to FIG. 1.

FIG. 3 shows a general view of a spring plate 110 surrounded by a spring plate frame 111 which is coupled to the spring plate 110 by four plate connecting elastic units 154. Thirty receptacle openings 48 arranged in a 6×5 matrix-form. Fixing holes 208 assigned to the elastic unit frame 111 and elastic unit actuation holes 258 allow for a flexible movement of the spring plate 110 relative to the spring plate frame 111.

Figure 4:
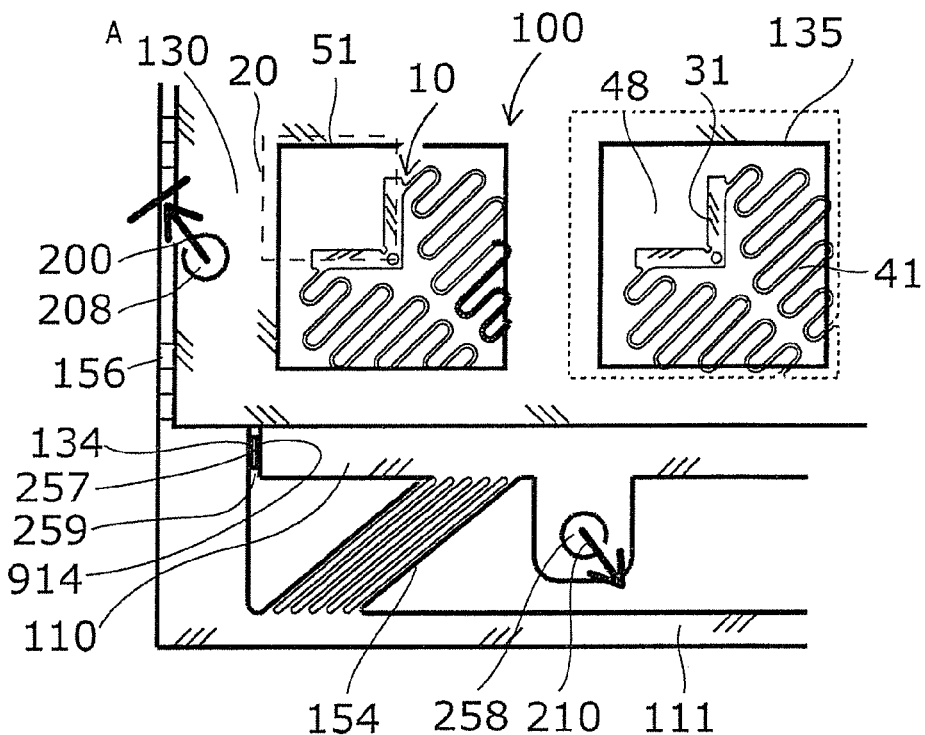
FIG. 4 and FIG. 5 show a detailed view of a carrier according to an exemplary embodiment of the invention.
Figure 5:
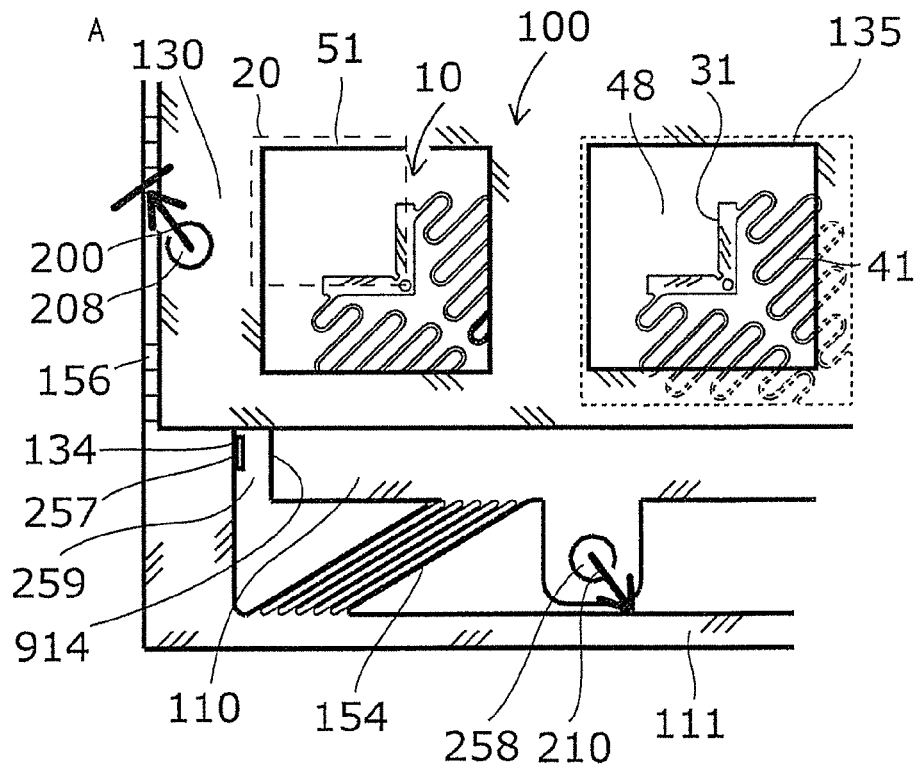

FIG. 4 and FIG. 5 show a view from above of a detail of a carrier 100 according to an exemplary embodiment of the invention, wherein the carrier 100 comprises a slidably elastic unit plate 110 elastically coupled to an elastic unit plate frame 111 via a plate connecting elastic unit 154. The elastic unit plate frame 111 is fixedly mounted at receiving plate 130. Thus, by bending the plate connecting elastic unit 154 the elastic unit plate 110 may slide relative to the receiving plate 130 having receiving openings 135 which form the second abutting sections 51. The first abutting sections 31 mounted at the elastic unit plate 110 via elastic units 41 may slide relative to the second abutting section 51 forming a fixed part of the receiving plate 130. A receptacle opening 48 of a receptacle 20 formed by the first abutting section 31 and the second abutting section 51 may be enlarged by sliding the elastic unit plate 110 relative to the receiving plate 130. By engaging elastic unit actuation hole 258 with an actuation force 210 the elastic unit plate 110 may be slid relative to the receiving plate 130 and the elastic unit plate frame 111 since the receiving plate 130 and the elastic unit plate frame 111 may be fixed at fixing hole 208. An opposing force 200 may be applied in order to fix the carrier 100 against the force of the actuation force 210. At several fixing points 156 the receiving plate 130 and the elastic unit plate frame 111 may be fixedly coupled to each other.

Still referring to FIG. 4 a first plate abutting section 134 of the receiving plate 130 and a second plate abutting section 914 of the elastic unit plate 110 abut with each other. A spacer 257 may be adapted to regulate the size of the receptacle opening 48. When the first plate abutting section 134 and the second plate abutting section 914 abut with each other the clamping size of the receptacle 20 formed by the first abutting section 31 and the second abutting section 51 may be reached. The size of the receptacle opening 48 may be smaller than the electronic component 1 to be received, so that the electronic component 1 may be clamped by the first abutting section 31 and the second abutting section 51. The space 259 between the elastic unit plate 110 and the elastic unit plate frame 111 may have the size of the spacer 257.

Referring to FIG. 5 a receiving size of the receptacle opening 48 is shown. The space 259 between the elastic unit plate 110 and the elastic unit plate frame 111 is enlarged. Therefore, also the size of the receptacle opening 48 may be enlarged to a size where the electronic component 1 may be received in the receptacle 20, i.e. in the space between the first abutting section 31 and the second abutting section 51.

Figure 6:
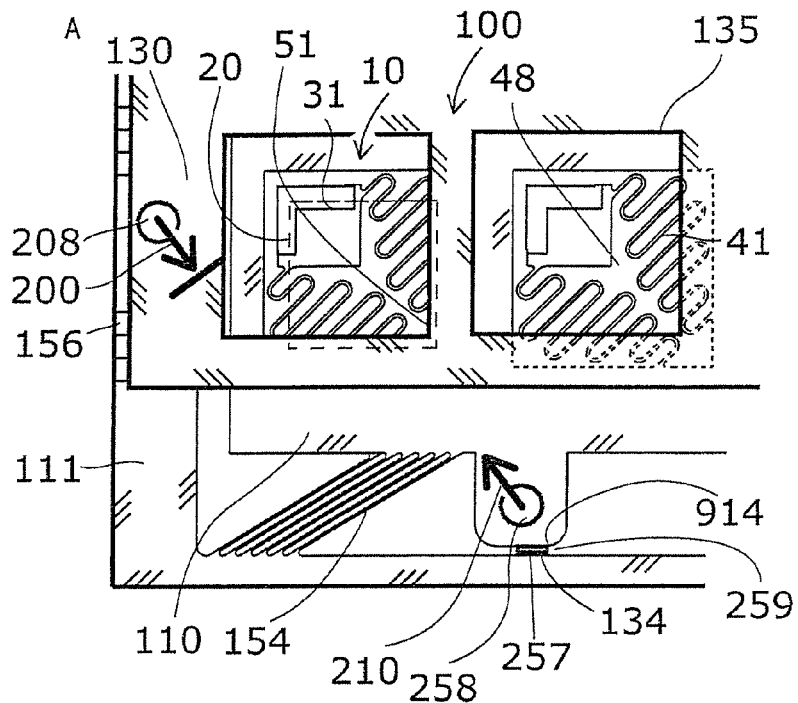
FIG. 6 and FIG. 7 show a detailed view of a carrier according to an exemplary embodiment of the invention.
Figure 7:
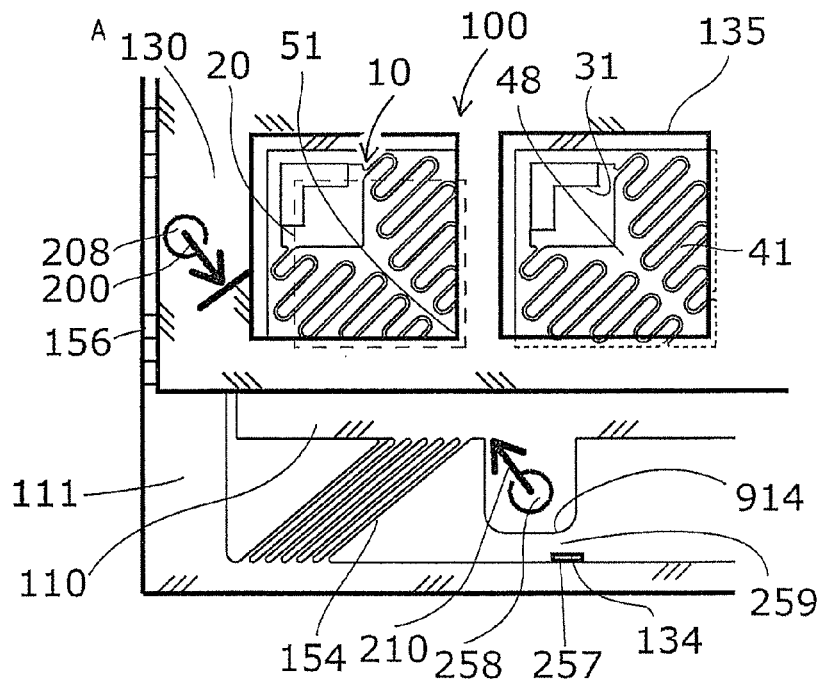

Referring to FIG. 6 and FIG. 7 the basic differences to FIG. 4 and FIG. 5, respectively, are that the clamping direction of the spring element 41 is opposed and therefore the direction of the actuation force 210 is opposed. Therefore, the spacer 257 may be situated on a diagonal side of the elastic unit plate frame 111.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A carrier adapted to receive and align multiple electronic components, the carrier comprising:
receptacles each being adapted to receive an assigned one of the multiple electronic components;
a first plate comprising a plurality of first abutting sections, wherein the first abutting sections form one of boundaries of the respective assigned receptacles;
a second plate comprising a plurality of second abutting sections, wherein the second abutting sections form another of the boundaries of the respective assigned receptacles;
wherein the first plate and the second plate are arranged slidably relative to each other, and
wherein the first plate and the second plate are elastically couple to each other by at least one plate connecting the elastic unit.

2. The carrier according to claim 1, wherein the first plate is an elastic unit plate comprising a plurality of elastic units, and wherein each of the receptacles has assigned at least one of the plurality of the elastic units.

3. The carrier according to claim 2, wherein a position and a deformation state of each of the elastic units determines one of the boundaries of the respective assigned receptacles.

4. The carrier according to claim 1, wherein:
the second plate comprises a first plate abutting section adapted for abutment of the first plate; and
the first plate comprises a second plate abutting section adapted for abutment of the second plate;
wherein the first plate abutting section and the second plate abutting section define a clamping size of the receptacles when the first plate abutting section and the second plate abutting section abut on each other; and
wherein the clamping size of the receptacles is adapted for a clamping of the electronic components in the respective receptacles.

5. The carrier according to claim 1, wherein the plate connecting elastic element and the plurality of elastic units are adapted to provide a total force for a self-acting transition from an enlarged size of the receptacles in which the electronic components are receivable in the receptacles towards a reduced clamping size of the receptacles in which the electronic components are clamped.

6. The carrier according to claim 1, further comprising:
handling structures formed at the first plate and at the second plate and adapted for engaging the first plate and the second plate to relatively move the slidably arranged first plate and second plate against a force of the plate connecting elastic element towards an enlarged size of the receptacles.

7. The carrier according to claims 1, further comprising:
a third plate, wherein the first plate is arranged floatingly between the second plate and the third plate;
wherein the second plate and the third plate are fixedly mounted to each other; and
wherein the first plate is an elastic unit plate and is adapted to allow for a mutual relocation of the multiple first abutting sections relative to the second abutting sections.

8. The carrier according to claims 1, further comprising:
a third plate, wherein the second plate is arranged floatingly between the first plate and the third plate;
wherein the first plate and the third plate are fixedly mounted to each other; and
wherein the first plate is an elastic unit plate and the second plate is adapted to allow for a mutual relocation of the multiple second abutting sections relative to the first abutting sections.

9. The carrier according to claims 1, wherein the first abutting sections are adapted to exert first forces and the second abutting sections are adapted to exert second forces on the electronic component, and wherein the first forces and the second forces are at least partially opposed to one another.

10. The carrier according to claim 9, wherein the first abutting sections and the second abutting sections are adapted so that the first forces are exerted parallel to a main plane of each of the receptacles and the second forces are exerted parallel to the main plane of the receptacles, the main plane of the receptacles is parallel to movement of the elastic unit.

11. The carrier according to claim 9, wherein the receptacles further comprise base support sections which form support surfaces parallel to a main plane of each of the receptacles and which are adapted for supporting a bottom side of the electronic components when being received in the receptacles, the main plane of the receptacles is parallel to movement of the elastic unit.

12. The carrier according to claims 9, wherein base support sections are adapted to exert support forces perpendicularly to the first forces and perpendicularly to the second forces.

13. The carrier according to claim 9, wherein the first abutting sections of the first plate are mounted in the carrier to be flexible and are adapted to perform a movement parallel to a main plane of the receptacles.

14. The carrier according to claim 1, further comprising:
at least one thickness adjusting plate adapted for adjusting a thickness of the carrier.

15. The carrier according to claim 1, wherein at least one of the elastic units comprise a spring element.

16. A method of operating a carrier to receive and align multiple electronic components comprising the steps of:
receiving an assigned one of the multiple electronic components in each of receptacles of the carrier;
providing a first plate of the carrier comprising a plurality of first abutting sections, wherein the first abutting sections form one of boundaries of the respective assigned receptacles;
providing a second plate of the carrier comprising a plurality of second abutting sections, wherein the second abutting sections form another of the boundaries of the respective assigned receptacles;
sliding the first plate and the second plate relative to each other to clamp the electronic components in the receptacles; and
coupling the first plate and the second plate elastically to each other by at least one plate connecting elastic unit.

17. The method of claim 16 further comprising the steps of placing the carrier in a post processing machine; and
subjecting the electronic components to a post-processing operation of the post-processing machine while the electronic components maintain in aligned positions in the receptacles of the carrier.

18. The method according to claims 16 further comprising the step of:
elastically clamping the electronic components by the clamping mechanism exclusively on side sections of the electronic components.

19. The method according to claim 16 further comprising the step of:
providing the carrier with an identifying feature for definite identification of the carrier.

* * * * *